(12) United States Patent
Francis

(10) Patent No.: US 11,711,081 B2
(45) Date of Patent: Jul. 25, 2023

(54) LOW FREQUENCY POWER SUPPLY SPUR REDUCTION IN CLOCK SIGNALS

(71) Applicant: XILINX, INC., San Jose, CA (US)

(72) Inventor: Roswald Francis, Kildare (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/511,833

(22) Filed: Oct. 27, 2021

(65) Prior Publication Data
US 2023/0127752 A1    Apr. 27, 2023

(51) Int. Cl.
| H03K 5/01 | (2006.01) |
|---|---|
| H03K 19/0185 | (2006.01) |
| H03K 19/17788 | (2020.01) |
| H03K 19/17736 | (2020.01) |
| H03K 19/00 | (2006.01) |

(52) U.S. Cl.
CPC ... *H03K 19/01855* (2013.01); *H03K 19/0016* (2013.01); *H03K 19/1774* (2013.01); *H03K 19/17788* (2013.01)

(58) Field of Classification Search
CPC ......... H03K 19/0016; H03K 19/01855; H03K 19/1774; H03K 19/17788
See application file for complete search history.

(56) References Cited

U.S. PATENT DOCUMENTS

| 8,970,275 B1 | 3/2015 | Ren | |
|---|---|---|---|
| 9,641,165 B1 * | 5/2017 | Mooraka | H03K 5/06 |
| 11,150,687 B1 * | 10/2021 | Mohan | G06F 1/04 |
| 2012/0306554 A1 * | 12/2012 | Ma | H03K 5/01 |
| | | | 327/276 |

* cited by examiner

*Primary Examiner* — Kurtis R Bahr
(74) *Attorney, Agent, or Firm* — Patterson + Sheridan, LLP

(57) ABSTRACT

Techniques and apparatus for reducing low frequency power supply spurs in clock signals in a clock distribution network. One example circuit for clock distribution generally includes a plurality of logic inverters coupled in series and configured to drive a clock signal and a current-starved inverter coupled in parallel (or in series) with a logic inverter in the plurality of logic inverters.

17 Claims, 8 Drawing Sheets

LOW FREQUENCY POWER SUPPLY SPUR REDUCTION IN CLOCK SIGNALS

TECHNICAL FIELD

Examples of the present disclosure generally relate to electronic circuits, and more specifically, to techniques and apparatus for reducing power supply spurs in clock signals.

BACKGROUND

Many different types of electronic devices may include a clock distribution network (also referred to as a "clock distribution chain") configured to provide clock signals to various electronic circuits on the device. The clock distribution chain may include a crystal oscillator or other component(s) to provide a reference clock signal, as well as any of various suitable circuit elements configured to drive the clock signals, such as buffers and/or logic inverters. These circuit elements may receive power from one or more power supply circuits, which may be implemented by one or more voltage regulators providing regulated and/or unregulated power supply voltages on corresponding power supply rails.

A voltage regulator ideally provides a constant direct current (DC) output voltage regardless of changes in load current or input voltage. Voltage regulators may be classified as linear regulators or switching regulators. While linear regulators tend to be relatively compact, many applications may benefit from the increased efficiency of a switching regulator. A linear regulator may be implemented by a low-dropout (LDO) regulator, for example. A switching regulator (also known as a "switching converter" or "switcher") may be implemented, for example, by a switched-mode power supply (SMPS), such as a buck converter, a boost converter, a buck-boost converter, or a charge pump.

SUMMARY

Certain aspects of the present disclosure generally relate to techniques and apparatus for reducing relatively low frequency spurs in relatively high frequency clock signals, such as low frequency power supply spurs in clock distribution chains.

Certain aspects of the present disclosure provide a circuit for clock distribution. The circuit generally includes a plurality of logic inverters coupled in series and configured to drive a clock signal and a current-starved inverter coupled (in parallel or in series) with a logic inverter in the plurality of logic inverters.

Certain aspects of the present disclosure provide a semiconductor die. The semiconductor die generally includes the circuit for clock distribution described herein.

Certain aspects of the present disclosure provide a method of clock distribution. The method generally includes driving a clock signal with a plurality of logic inverters coupled in series and receiving power from a power supply voltage; and adjusting for changes in the power supply voltage using a current-starved inverter coupled (in parallel or in series) with a logic inverter in the plurality of logic inverters.

These and other aspects may be understood with reference to the following detailed description.

BRIEF DESCRIPTION OF DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of the scope of the claims.

To facilitate understanding, identical reference numerals have been used, where possible, to designate identical elements that are common to the figures. It is contemplated that elements of one example may be beneficially incorporated in other examples without specific recitation.

DETAILED DESCRIPTION

Figure 1A:
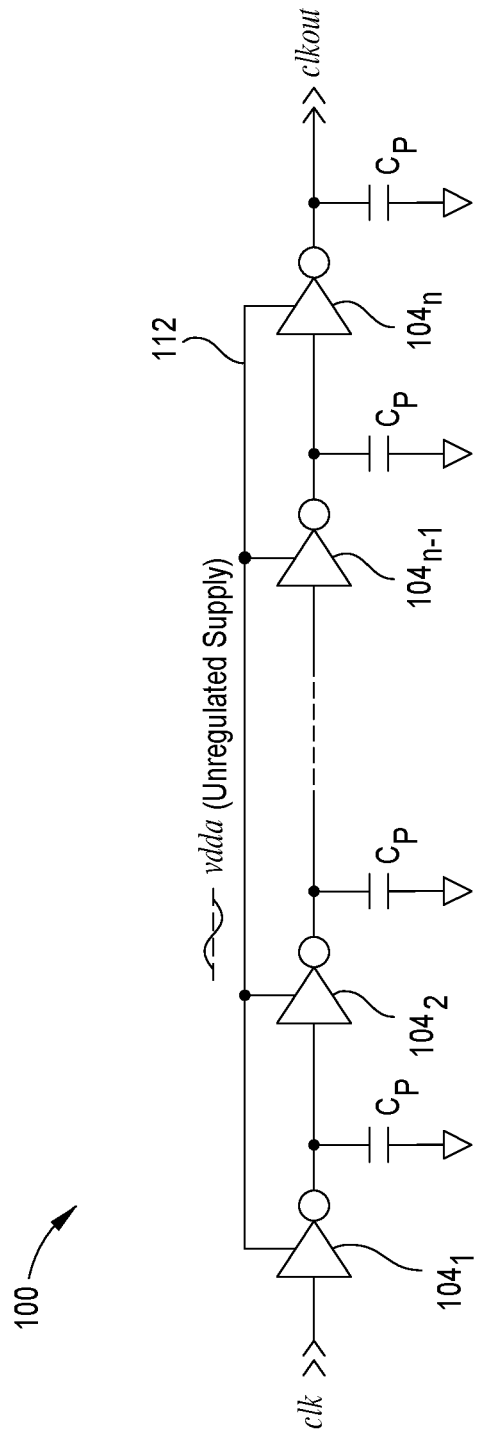
FIG. 1A is a block diagram of a clock distribution chain receiving power from an unregulated supply, in which aspects of the present disclosure may be practiced.

Certain aspects of the present disclosure generally relate to techniques and apparatus for cancelling, or at least reducing, relatively low frequency spurs in relatively high frequency clock signals, such as low frequency power supply spurs in clock distribution chains.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. The figures are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Example Clock Distribution Chain

An electronic device, a system on a chip (SoC), or an integrated circuit (e.g., a processor, a field-programmable gate array (FPGA), or an application-specific integrated circuit (ASIC)) may include a clock distribution chain configured to provide clock signals to various electronic circuits thereon. The clock distribution chain may include a crystal oscillator or other component(s) to provide a reference clock signal, as well as any of various suitable circuit elements configured to drive the clock signals, such as buffers and/or logic inverters. These circuit elements may receive power from one or more power supply circuits, which may be implemented by one or more voltage regulators providing regulated and/or unregulated power supply voltages on corresponding power supply rails.

FIG. 1A is a block diagram of an example clock distribution chain 100 receiving power from an unregulated power supply domain. As shown, the clock distribution chain 100 includes a set of n logic inverters $104_1$, $104_2$, ..., $104_n$ (collectively referred to herein as the "set of logic inverters 104"). The set of logic inverters 104 may include any suitable number of logic inverters (e.g., n is any positive integer). Furthermore, it is to be understood that one or more of the logic inverters may be replaced by other types of clock drivers, such as buffers. The outputs of the logic inverters 104 are represented as having a shunt parasitic capacitance Cp to a reference potential node (e.g., electrical ground) for the clock distribution chain 100.

During operation, the logic inverter $104_1$ receives the clock signal (labeled "clk") at its input and generates a complementary clock signal (clk_bar) at its output. The clock signal may have a relatively high frequency of hundreds of MHz to tens of GHz, for example. The clock distribution chain 100 propagates the clock signal from the input of the logic inverter $104_1$ to the output of the logic inverter $104_n$. The propagated clock signal at the output of the logic inverter $104_n$ is labeled "clkout" and may be the same as or the inverse of clk, depending on the numbers and types of clock drivers in the clock distribution chain 100. The output clock signal clkout may also be a delayed version of the input clock signal clk, since each logic inverter 104 may introduce a finite delay.

The set of logic inverters 104 have power supply inputs coupled to a power supply rail 112 generated by a power supply circuit (not shown). The power supply circuit may generate an unregulated power supply voltage (labeled "vdda") on the power supply rail 112. For certain aspects, the power supply circuit may be an off-chip power supply circuit, meaning that the power supply circuit is not located in the same semiconductor die as the clock distribution chain 100.

In some cases, the power supply circuit may be a switching regulator, which may have a relatively low switching frequency in a range of 100 kHz to a few MHz, for example. Therefore, the power supply circuit may introduce this low frequency content into the power supply rail 112, which may modulate the edges of the clock signals in the set of logic inverters 104. In other words, assume a clock driver has a certain performance at a nominal DC value for the power supply voltage vdda. When the unregulated supply voltage vdda rises above its nominal DC value (e.g., due to the switching frequency), the clock driver may have more current and get faster, thereby decreasing the delay in the clock signal and pulling an edge to be earlier in time. In contrast, when the unregulated supply voltage vdda falls below its nominal DC value, the clock driver may have less current and get slower, thereby increasing the delay in the clock signal and effectively pushing out an edge to be later in time. Modulating the edges of the clock signals in this manner may likely create spurs in the clkout signal at the output of the clock distribution chain 100. In a transceiver chain, for example, such spurs may mix with data signals and may appear as spurious tones.

Example Low Frequency Spur Reduction in Clock Signals

Certain aspects of the present disclosure provide techniques and apparatus for eliminating, or at least reducing, these low frequency power supply spurs in clock signals of a clock distribution chain. For certain aspects, this clock spur reduction may be accomplished in the current domain by adjusting a clock driver current to counteract the low frequency modulation of the unregulated power supply voltage (vdda) signal. In this manner, the clock driver current—and hence, the delay in the clock edges—may be maintained (or at least held more constant) regardless of the changes in the unregulated power supply voltage.

Figure 1B:
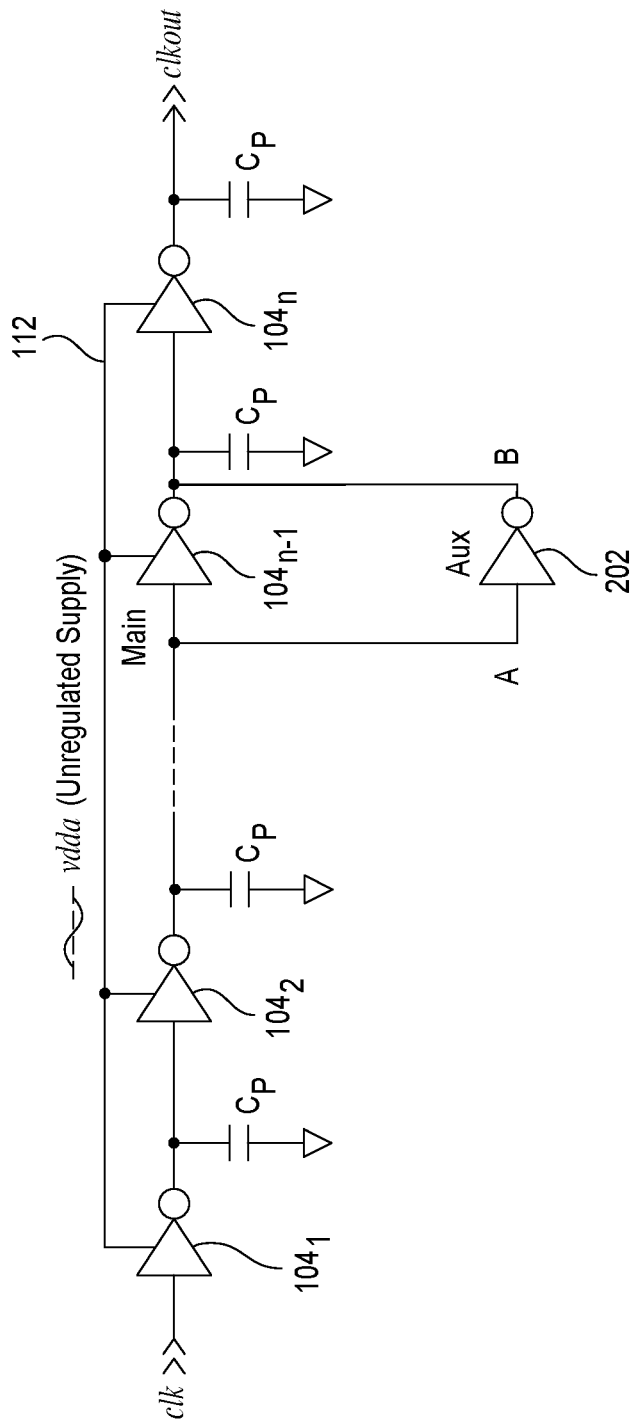
FIG. 1B is a block diagram of a clock distribution chain where one of the main series-connected inverters has an auxiliary inverter coupled in parallel therewith, according to certain aspects of the present disclosure.

This type of "current-domain cancellation" technique may be achieved, for example, by adding an auxiliary driver in parallel (or in series) with any of the clock drivers in the dock distribution chain 100. For example, FIG. 1B illustrates an auxiliary inverter 202 (labeled "Aux") coupled in parallel with inverter $104_{n-1}$ (labeled "Main"). In this manner, the auxiliary inverter 202 and the main inverter $104_{n-1}$ both have an input coupled to node A and both have an output coupled to node B. Like the main inverter $104_{n-1}$, the auxiliary inverter 202 may have a power input coupled to the power supply rail 112. The auxiliary inverter 202 may have a current varied opposite to the polarity of the low frequency content of the voltage vdda. Whereas the main inverter $104_{n-1}$ may have a stronger current when the voltage vdda increases, the auxiliary inverter 202 should have a weaker current when the voltage vdda increases, and vice versa. Therefore, the auxiliary inverter 202 may be implemented by a current-starving inverter, for example. For certain aspects, a single auxiliary inverter 202 may be designed to current compensate, or at least adjust, for the entire clock distribution chain 100, with a current gain designed accordingly.

Although the auxiliary inverter 202 is coupled in parallel with logic inverter $104_{n-1}$ in the example of FIG. 1B, it is to be understood that the auxiliary inverter may be coupled in parallel with any one of the logic inverters 104, at the beginning, the end, or anywhere in the middle of the clock distribution chain 100. For some examples, the auxiliary inverter 202 may be coupled in series with any of the logic inverters 104. Furthermore, the clock distribution chain may include more than one auxiliary inverter, each auxiliary inverter coupled in parallel or in series with one of the logic inverters 104. In the case of multiple auxiliary inverters in a dock distribution chain, each auxiliary inverter may have less current compensation (e.g., less current gain) than compared to a single auxiliary inverter for the same chain; in other words, the current compensation may be distributed among the multiple auxiliary inverters.

Figure 2B:
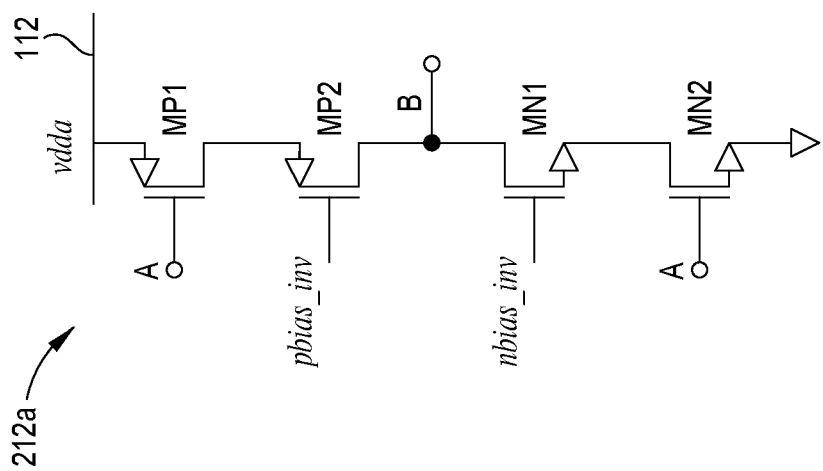
FIGS. 2A and 2B illustrate example circuit implementations of current-starved inverters for the auxiliary inverter of FIG. 1B, according to certain aspects of the present disclosure.
Figure 2A:
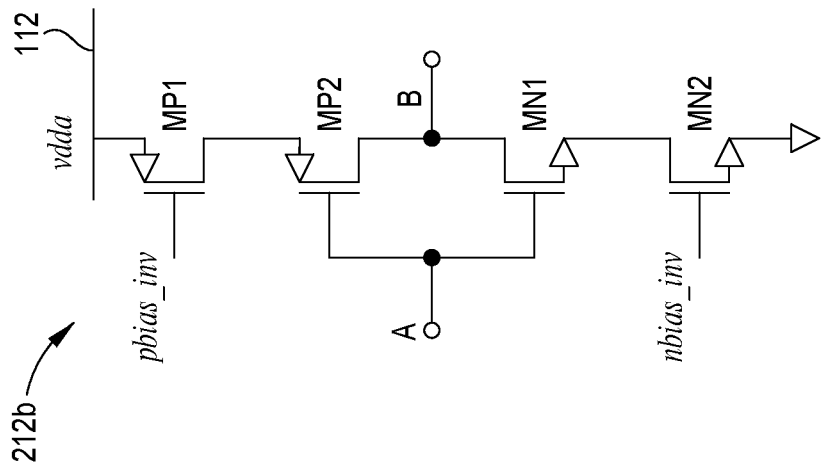

FIG. 2A is a circuit diagram of an example current-starved inverter 212a for implementing the auxiliary inverter 202 of FIG. 1B, according to certain aspects of the present disclosure. The current-starved inverter 212a includes two p-type transistors MP1, MP2 and two n-type transistors MN1, MN2. Transistor MP1 is an inverter transistor and has a source coupled to the power supply rail 112 with the voltage vdda and has a gate coupled to an input of the inverter 212a, where the input is coupled to node A. Transistor MP2 is a current-setting transistor (also referred to as a biasing transistor). Transistor MP2 has a source coupled to a drain of transistor MP1, has a gate coupled to a p-type bias node (labeled "pbias_inv"), and has a drain coupled to an output of the inverter 212a, where the output is coupled to node B. Transistor MN1 is a current-setting transistor and has a drain coupled to the output of the inverter 212a (coupled to node B) and has a gate coupled to an n-type bias node (labeled "nbias_inv"). Transistor MN2 is an inverter transistor and has a drain coupled to a source of transistor MN1, has a gate coupled to the input of the inverter 212a (coupled to node A), and has a source coupled to a reference potential node (e.g., electrical ground) for the inverter 212a.

In a typical complementary metal-oxide-semiconductor (CMOS) inverter, the p-type and n-type transistors are directly connected to the power supply rails, and thus, the inverter can draw as much current as it likes. In a current-starved inverter, two more transistors (e.g., current-setting transistors MP2 and MN1) are added. In this case, lowering the bias voltage of the n-type bias node (nbias_inv) and increasing the bias voltage of the p-type bias node (pbias_inv) increases the effective drive resistance (Req) of the inverter, thereby increasing the delay of the inverter. In contrast, raising nbias_inv and decreasing pbias_inv decreases Req, thereby decreasing the delay. The biasing voltages for the p-type and n-type bias nodes may be generated using any of various suitable techniques, such as by using a current source and current mirrors, as described below with respect to FIGS. 3 and 4.

FIG. 2B is a circuit diagram of another example current-starved inverter 212b for implementing the auxiliary inverter 202 of FIG. 1B, according to certain aspects of the present disclosure. The current-starved inverter 212b is similar to the current-starved inverter 212a of FIG. 2A, except that the two inputs to the p-type transistors MP1, MP2 are swapped and the two inputs to the n-type transistors MN1. MN2 are swapped. More specifically, in inverter 212b, the gate of transistor MP1 is coupled to the p-type bias node, the gate of transistor MN2 is coupled to the n-type bias node, and the gates of transistors MP2 and MN1 are coupled to the input of the inverter 212b (coupled to node A). Thus, in inverter 212b, transistors MP1 and MN2 function as the current-setting transistors, whereas transistors MP2 and MN1 function as the inverter transistors.

Figure 3A:
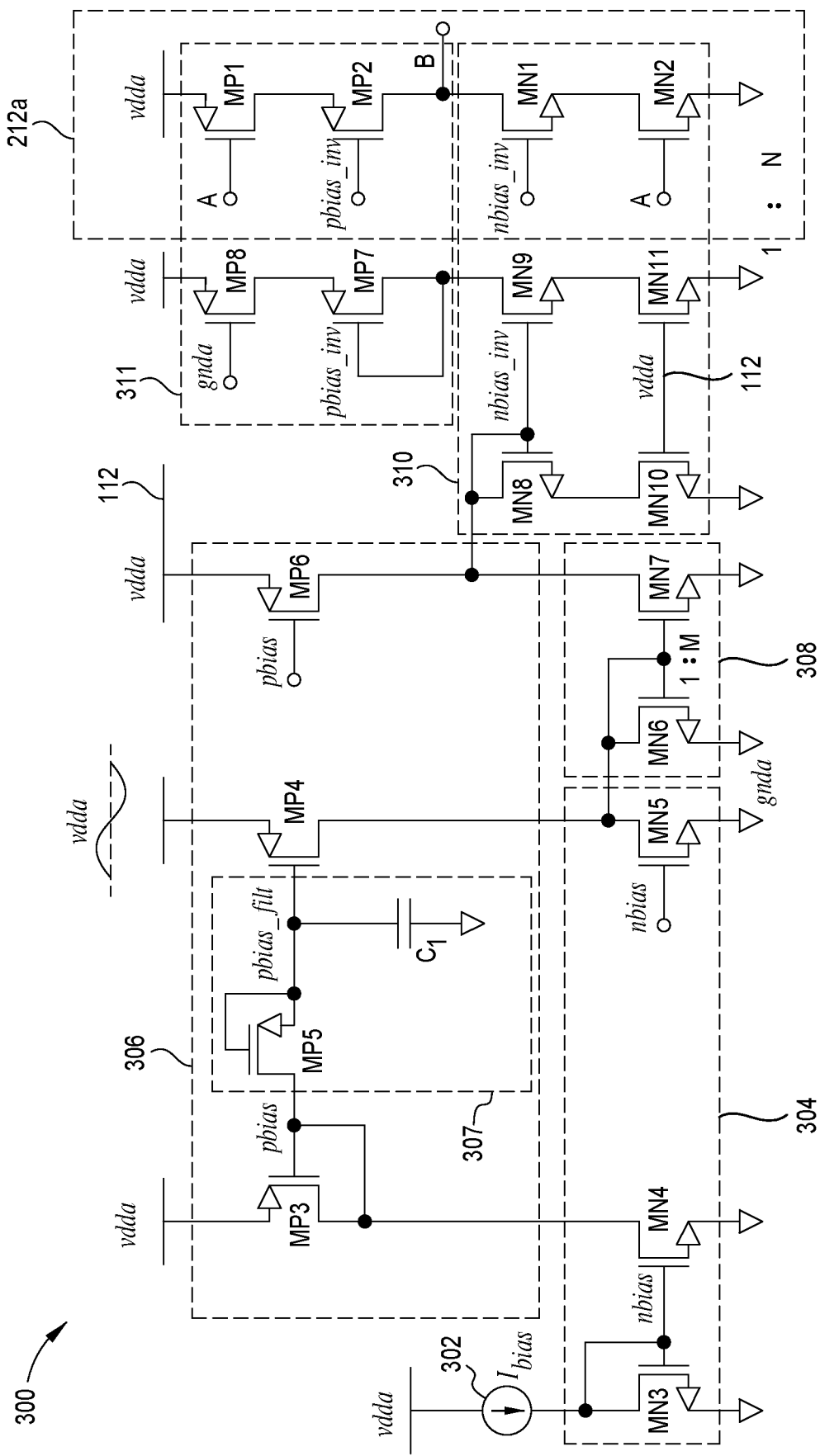
FIG. 3A is a circuit diagram illustrating an example implementation of a biasing circuit for the current-starved inverter of FIG. 2A, according to certain aspects of the present disclosure.
Figure 3B:
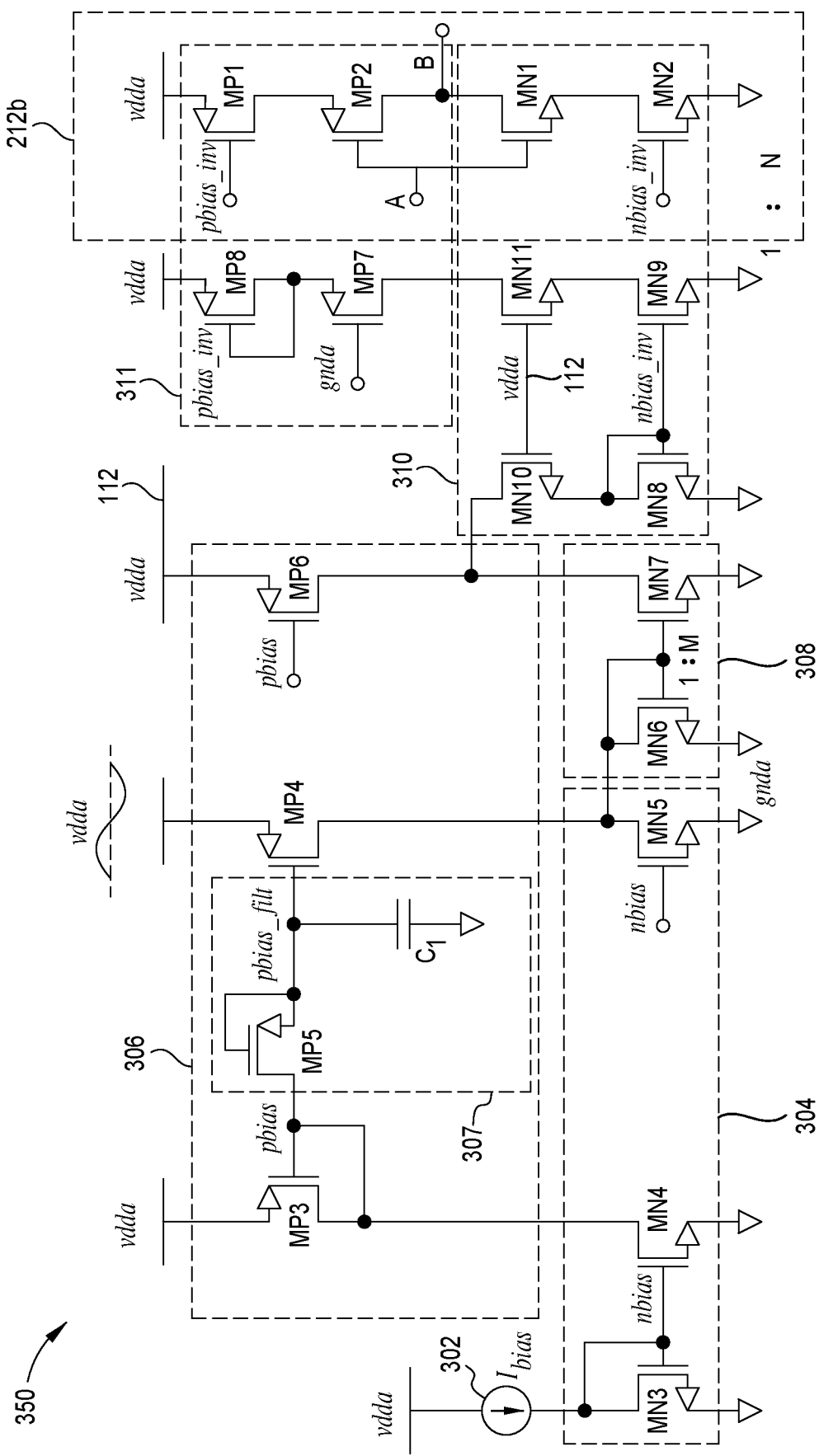
FIG. 3B is a circuit diagram illustrating an example implementation of a biasing circuit for the current-starved inverter of FIG. 28, according to certain aspects of the present disclosure.

FIG. 3A is a circuit diagram illustrating an example implementation of a biasing circuit 300 for the current-starved inverter 212a of FIG. 2A, according to certain aspects of the present disclosure. FIG. 3B is a circuit diagram illustrating an example implementation of a biasing circuit 350 for the current-starved inverter 212b of FIG. 2B, according to certain aspects of the present disclosure. The biasing circuit 350 of FIG. 3B is similar to the biasing circuit 300 of FIG. 3A, and therefore, the following description will focus on the biasing circuit 300 of FIG. 3A, pointing out differences between the two biasing circuits. Otherwise, the following description of the biasing circuit 300 of FIG. 3A may also apply to the biasing circuit 350 of FIG. 3B.

The biasing circuit 300 of FIG. 3A includes a reference current source 302, a first current mirror 304, a second current mirror 306, a third current mirror 308, a fourth current mirror 310, and a fifth current mirror 311.

The current source 302 may source a constant bias current $I_{bias}$, which may act as a reference current for the biasing circuit 300. The current source 302 may be coupled between the power supply rail 112 and a first branch (also referred to as "an input branch") of the first current mirror 304, which also includes n-type transistor MN3. Transistor MN3 has a drain and a gate coupled together (at a node labeled "nbias") and coupled to the current source 302. Transistor MN3 also has a source coupled to a reference potential node (e.g., electrical ground) of the biasing circuit 300. A second branch (also referred to as "an output branch") of the first current mirror 304 includes an n-type transistor MN4, which has a gate coupled to the nbias node, has a source coupled to the reference potential node, and has a drain coupled to a first branch of the second current mirror 306. A third branch of the first current mirror 304 includes an n-type transistor MN5, which has a gate coupled to the nbias node, a source coupled to the reference potential node, and a drain coupled to a second branch of the second current mirror 306. In some cases, transistors MN3, MN4, and MN5 have a 1:1:1 ratio. In this manner, the current through transistors MN3, MN4, and MN5 may be equal to the reference current $I_{bias}$.

The second current mirror 306 includes a low-pass filter 307 coupled between the first and second branches of the second current mirror. The first branch of the second current mirror 306 includes a p-type transistor MP3, which has a source coupled to the power supply rail 112. Transistor MP3 also has a drain and a gate coupled together (at a node labeled "pbias"), coupled to the drain of transistor MN4, and coupled to an input of the low-pass filter 307. For certain aspects, the low-pass filter 307 may be implemented as a single-pole low-pass filter as shown in FIG. 3A, but could be implemented using additional poles. As an example of a single-pole low-pass filter, the low-pass filter 307 may include a series resistive element (implemented by p-type transistor MP5) coupled between the input and the output of the low-pass filter and a shunt capacitor $C_1$ coupled between the output of the low-pass filter and the reference potential node. For certain aspects, the low-pass filter 307 may have a relatively low cutoff frequency (e.g., around 10 to 500 Hz). Thus, transistor MP5 may be operated in its subthreshold region to generate a relatively large resistance, such that the relatively low cutoff frequency can be achieved without a relatively large capacitance for capacitor $C_1$. The second branch of the second current mirror 306 includes a p-type transistor MP4, which has a source coupled to the power supply rail 112, has a gate coupled to the output of the low-pass filter (at a node labeled "pbias_filt"), and has a drain coupled to the drain of transistor MN5 and a first branch of the third current mirror 308. A third branch of the second current mirror 306 includes a p-type transistor MP6, which has a gate coupled to the pbias node, a source coupled to the power supply rail 112, and a drain coupled to a second branch of the third current mirror 308. In some cases, transistors MP3, MP4, and MP5 have a 1:1:1 ratio. In this manner, the current through transistors MP3 and MP5 may be equal to the reference current $I_{bias}$. The current through transistor MP4 is described below.

The first branch of the third current mirror 308 includes an n-type transistor MN6 having a gate and a drain coupled together, to the third branch of the first current mirror 304, and to the second branch of the second current mirror 306. The second branch of the third current mirror 308 includes an n-type transistor MN7, which has a gate coupled to the gate and drain of transistor MN6, has a source coupled to the reference potential node, and has a drain coupled to the third branch of the second current mirror 306 and to a first branch of the fourth current mirror 310. In some cases, transistors MN6 and MN7 have a 1:M ratio. In this manner, the current through transistor MN6 will effectively be amplified, such that the current through transistor MN7 will be M times greater.

The first branch (also referred to as "an input branch") of the fourth current mirror 310 includes n-type transistors MN8 and MN10. In the biasing circuit 300 of FIG. 3A, transistor MN8 has a gate and a drain coupled together (at a node labeled "nbias_inv"), to the third branch of the second current mirror 306, and to the second branch of the third current mirror 308. A source of transistor MN8 is coupled to a drain of n-type transistor MN10, which has a source coupled to the reference potential node. The second branch (also referred to as "an output branch) of the fourth current mirror 310 includes n-type transistors MN9 and MN11. Transistor MN9 has a gate coupled to the nbias_inv node. A source of transistor MN9 is coupled to a drain of n-type transistor MN11, which has a source coupled to the reference potential node. The gates of transistors MN10 and MN11 are coupled to the power supply rail 112, such that transistors MN10 and MN11 function as resistors and the fourth current mirror 310 is a degenerated current mirror.

In the biasing circuit 350 of FIG. 3B, transistor MN10 has a drain coupled to the third branch of the second current mirror 306 and to the second branch of the third current mirror 308. Transistor MN8 has a gate and a drain coupled together (at a node labeled "nbias_inv") and to a source of transistor MN10, and a source of transistor MN8 is coupled to the reference potential node. Also in FIG. 3B, a source of transistor MN11 is coupled to a drain of transistor MN9, which has a source coupled to the reference potential node.

The third branch of the fourth current mirror 310 includes an n-type biasing transistor in the current-starved inverter, such as transistor MN1 in the current-starved inverter 212a (as shown in FIG. 3A) or transistor MN2 in the current-starved inverter 212b (as shown in FIG. 3B). The gate of the n-type current-setting transistor (e.g., transistor MN1 in inverter 212a or transistor MN2 in inverter 212b) is also coupled to the nbias_inv node to control the current in the current-starved inverter when the n-type inverter transistor (e.g., transistor MN2 in inverter 212a or transistor MN1 in inverter 212b) is on. In some cases, transistors MN8, MN9, and MN1 in inverter 212a (or MN2 in inverter 212b) have a 1:1:N ratio, as shown. In this manner, the current through transistor MN8 will be replicated in transistor MN9 and will effectively be amplified in transistor MN1 (or MN2), such that the current through transistor MN1 (or MN2) will be N times greater.

A first branch of the fifth current mirror 311 includes p-type transistors MP7 and MP8. A drain of transistor MN9 is coupled to a drain and a gate of p-type transistor MP7, at a node labeled "pbias_inv." A source of transistor MP7 is coupled to a drain of p-type transistor MP8. Transistor MP8 has a source coupled to the power supply rail 112 and a gate coupled to the reference potential node (labeled "gnda"), such that transistor MP8 functions as a resistor during operation of the biasing circuit 300. The pbias_inv node is also coupled to the gate of the p-type current-setting transistor (e.g., transistor MP2 in inverter 212a or transistor MP1 in inverter 212b) to control the current in the current-starved inverter when the p-type inverter transistor (e.g., transistor MP1 in inverter 212a or transistor MP2 in inverter 212b) is on. As such, transistors MP1 and MP2 in inverter 212a or inverter 212b form a second branch of the fifth current mirror 311.

During operation of the biasing circuit 300 (or the biasing circuit 350), the current source 302 may provide a constant current $I_{bias}$, independent of the unregulated supply voltage vdda. Therefore, the first, second, and third branches of the first current mirror 304 will sink this constant current $I_{bias}$ through transistors MN3, MN4, and MN5. Thus, the first and third branches of the second current mirror 306 will also have the constant current $I_{bias}$ through transistors MP3 and MP6. Since transistor MP3 is high bandwidth, any change to the voltage vdda at the source of transistor MP3 will appear nearly instantaneously at the pbias node. However, the low-pass filter 307 will filter out high frequencies above its cutoff frequency, such that the pbias_filt node may essentially see only DC or very low frequencies, lower than the switching frequency modulating voltage vdda. Therefore, increases in the voltage vdda will increase the current through transistor MP4, and since the current through transistor MN5 is constant (e.g., a constant current sink), the increased current in transistor MP4 will cause increased current in transistor MN6. The increased current in transistor MN6 will be amplified by the ratio 1:M of the third current mirror 308 to appear as amplified increased current through transistor MN7. Because the current through transistor MP6 is constant, the increased current through transistor MN7 will cause reduced current through the first branch of the fourth current mirror 310 (e.g., through transistors MN8 and MN10). This reduced current through transistor MN8 will lead to decreased current through the second branch of the fourth current mirror 310 (through transistors MN9 and MN11) and the first branch of the fifth current mirror 311 (through transistors MP7 and MP8), which will cause an amplified current reduction in the n-type current-setting transistor (e.g., transistor MN1 in inverter 212a) and in the p-type current-setting transistor (e.g., transistor MP2 in inverter 212a) amplified by the ratio 1:N. This current reduction in the n-type and p-type current-setting transistors will lead to a weaker current-starved inverter, which is the objective when the voltage vdda increases. In other words, when the voltage vdda increases, the main inverter in the clock distribution chain will have a stronger current (e.g., leading to less delay and a speeding up of the clock signal edges), but the auxiliary inverter will have an amplified weaker current (amplified by M×N), which leads to more delay and slows down the clock signal edges. In this manner, current-domain cancellation, or at least reduction, is accomplished.

Likewise, decreases in the voltage vdda will have the opposite effect. More specifically, decreases in the voltage vdda will reduce the current through transistor MP4, and since the current through transistor MN5 is constant, the reduced current in transistor MP4 will cause reduced current in transistor MN6. The reduced current in transistor MN6 will be amplified by the ratio 1:M of the third current mirror 308 to appear as amplified current reduction through transistor MN7. Because the current through transistor MP6 is constant, the reduced current through transistor MN7 will cause increased current through the first branch of the fourth current mirror 310 (e.g., through transistors MN8 and MN10). This increased current through transistor MN8 will lead to increased current through the second branch of the fourth current mirror 310 (through transistors MN9 and MN11) and the first branch of the fifth current mirror 311 (through transistors MP7 and MP8), which will be amplified by the ratio 1:N in the n-type current-setting transistor (e.g., transistor MN1 in inverter 212a) and in the p-type current-setting transistor (e.g., transistor MP2 in inverter 212a). This amplified current increase in the n-type and p-type current-setting transistors will lead to a stronger current-starved inverter, which is the objective when the voltage vdda decreases. In other words, when the voltage vdda decreases, the main inverter in the clock distribution chain will have a weaker current (e.g., leading to more delay and a slowing down of the clock signal edges), but the auxiliary inverter will have an amplified stronger current (amplified by M×N), which leads to less delay and speeds up the clock signal edges. In this manner, current-domain cancellation, or at least reduction, is accomplished, in the opposite direction from that described above.

Figure 4A:
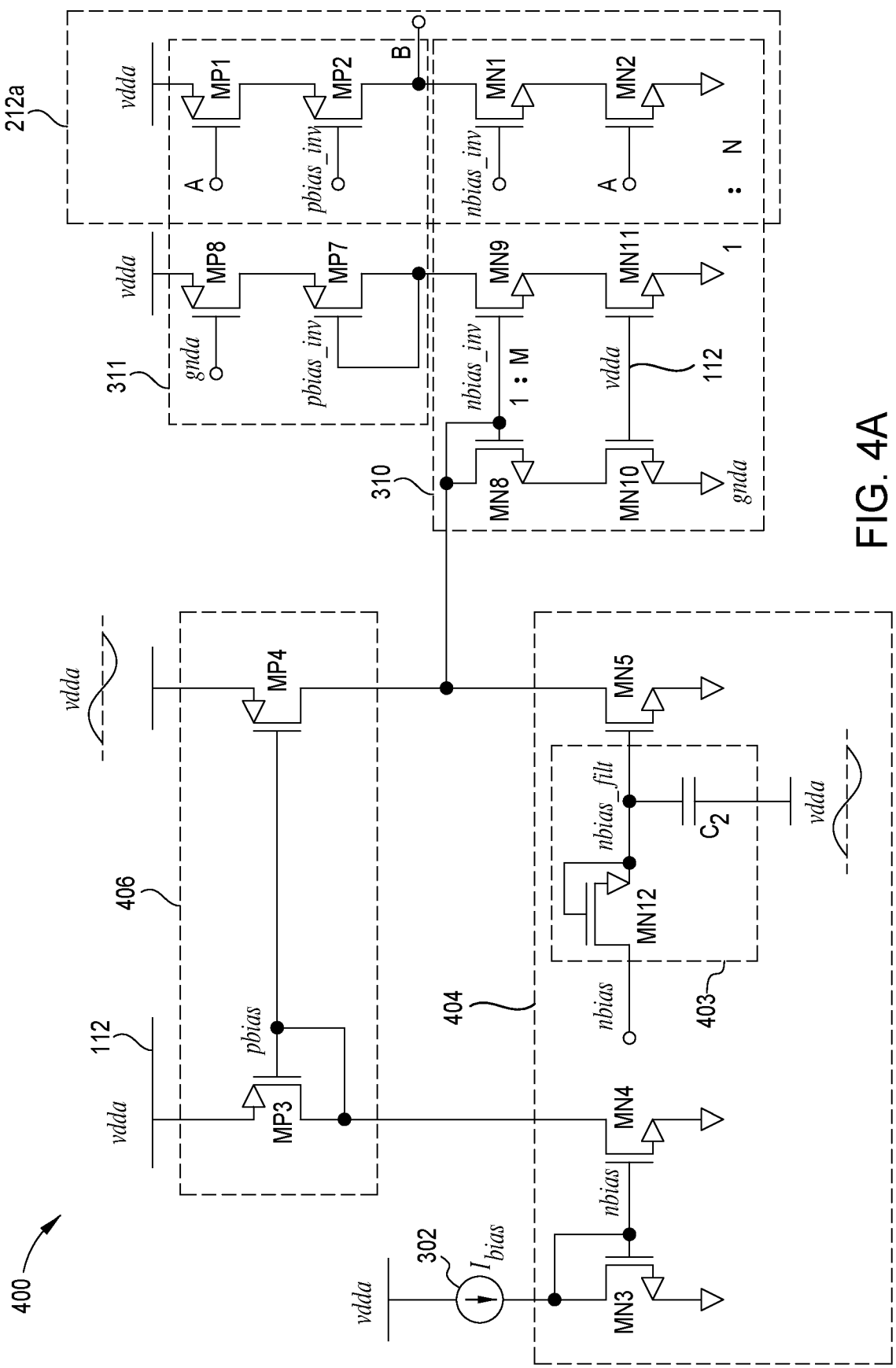
FIG. 4A is a circuit diagram illustrating an alternative implementation of a biasing circuit for the current-starved inverter of FIG. 2A, according to certain aspects of the present disclosure.
Figure 4B:
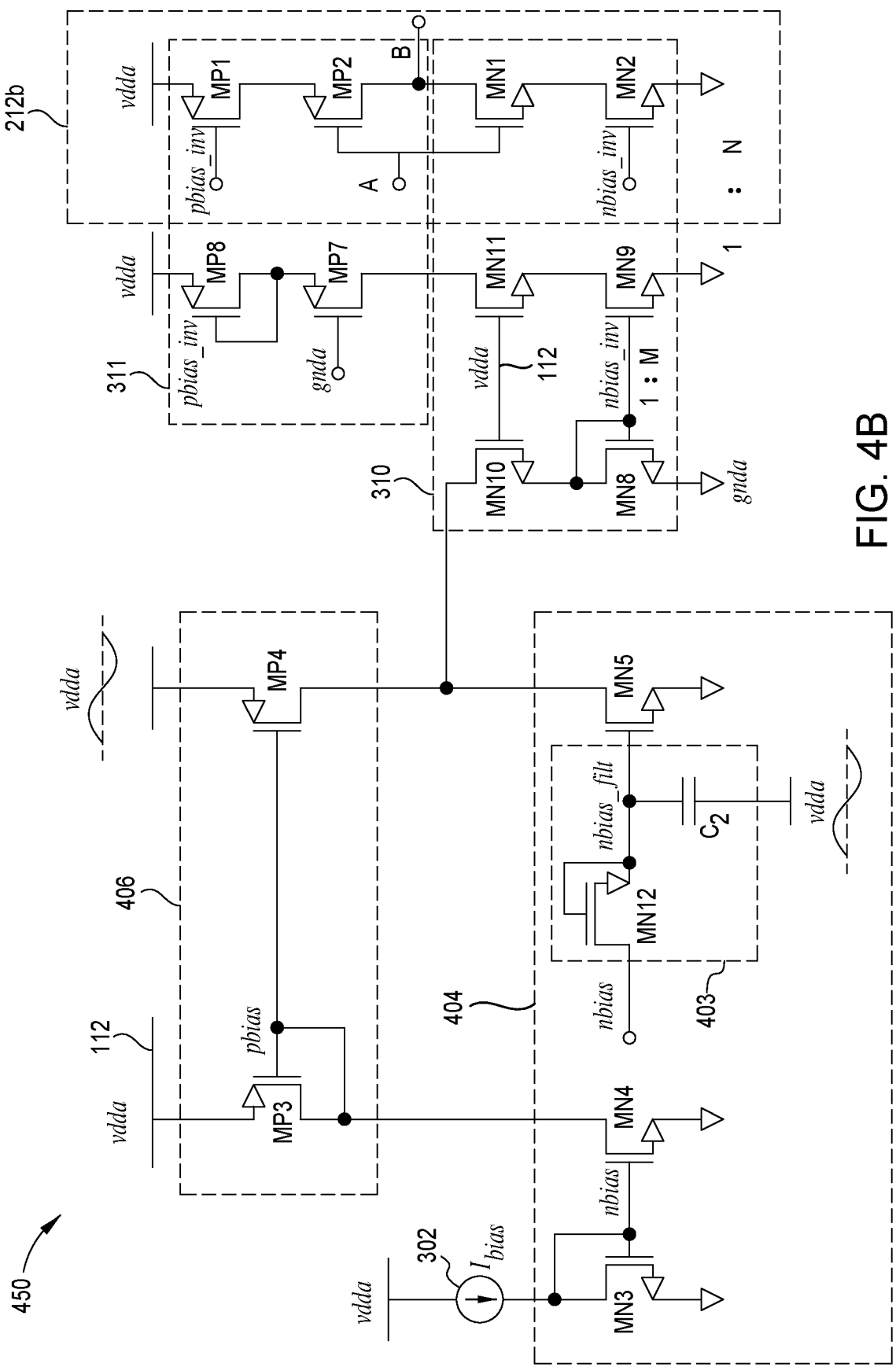
FIG. 4B is a circuit diagram illustrating an alternative implementation of a biasing circuit for the current-starved inverter of FIG. 2B, according to certain aspects of the present disclosure.

FIG. 4A is a circuit diagram illustrating an alternative implementation of a biasing circuit 400 for the current-starved inverter 212a of FIG. 2A, according to certain aspects of the present disclosure. FIG. 4B is a circuit diagram illustrating an alternative implementation of a biasing circuit 450 for the current-starved inverter 212b of FIG. 2B, according to certain aspects of the present disclosure. The biasing circuit 450 of FIG. 4B is similar to the biasing circuit 400 of FIG. 4A, and therefore, the following description will focus on the biasing circuit 400 of FIG. 4A, pointing out differences between the two biasing circuits. Otherwise, the following description of the biasing circuit 400 of FIG. 4A may also apply to the biasing circuit 450 of FIG. 4B.

The biasing circuit 400 of FIG. 4A includes the current source 302, a first current mirror 404, a second current mirror 406, a third current mirror (e.g., the fourth current mirror 310 of FIG. 3A), and a fourth current mirror (e.g., the fifth current mirror 311 of FIG. 3A).

Similar to the first current mirror 304 of FIG. 3A, a first branch of the first current mirror 404 in FIG. 4A includes transistor MN3 with similar connections, a second branch of the first current mirror 404 includes transistor MN4 with similar connections, and a third branch of the first current mirror 404 includes transistor MN5. The first current mirror 404 includes a high-pass filter 403 coupled between the second and third branches of the first current mirror. For certain aspects, the high-pass filter 403 may be implemented as a single-pole high-pass filter as shown in FIG. 4A, but could be implemented using additional poles. As an example of a single-pole high-pass filter, the high-pass filter 403 may include a series capacitor $C_2$ coupled between the power supply rail 112 (the filter input) and a node labeled "nbias_filt" (the filter output, which is coupled to the gate of transistor MN5) and a shunt resistive element (implemented by n-type transistor MN12) coupled between the output of the high-pass filter and the nbias node. For certain aspects, the high-pass filter 403 may have a relatively low cutoff frequency (e.g., around 10 to 500 Hz). Thus, transistor MN12 may be operated in its subthreshold region to generate a relatively large resistance, such that the relatively low cutoff frequency can be achieved without a relatively large capacitance for capacitor $C_2$. In some cases, transistors MN3, MN4, and MN5 have a 1:1:1 ratio. In this manner, the current through transistors MN3 and MN4 may be equal to the reference current $I_{bias}$. The current through transistor MN5 is described below.

Similar to the second current mirror 306 of FIG. 3A, a first branch of the second current mirror 406 in FIG. 4A includes transistor MP3 and a second branch of the second current mirror 406 includes transistor MP4. There may be no third branch in the second current mirror 406. In the second current mirror 406, the pbias node is coupled to the gate of transistor MP4 without a low-pass filter. In the biasing circuit 400, the nbias_inv node is coupled to the drain of transistor MP4 (in the second branch of the second current mirror 406) and to the drain of transistor MN5 (in the third branch of the first current mirror 404). The remainder of the biasing circuit 400 (or the biasing circuit 450) may be the same or similar to the biasing circuit 300 of FIG. 3A (or the biasing circuit 350 of FIG. 3B). In some cases, transistors MN8 and MN9 (and transistors MN10 and MN11) have a 1:M size ratio. In this manner, the current through transistor MN8 (and transistor MN10) will effectively be amplified, such that the current through transistor MN9 (and transistor MN11) will be M times greater.

During operation of the biasing circuit 400 (or biasing circuit 450), the current source 302 may provide a constant current $I_{bias}$, independent of the unregulated supply voltage vdda. Therefore, the first and second branches of the first current mirror 404 will sink this constant current $I_{bias}$ through transistors MN3 and MN4. Thus, the first and second branches of the second current mirror 406 will also have the constant current $I_{bias}$ through transistors MP3 and MP4. The gate (e.g., the control input) of transistor MN5 is decoupled from the nbias node by the resistive element in the high-pass filter 403 and is AC-coupled to the power supply rail 112 by capacitor $C_2$. The high-pass filter 403 will filter out low frequencies below its cutoff frequency, such that the nbias_filt node may essentially see only higher frequencies, including the switching frequency modulating voltage vdda. That is, spurs in the voltage vdda are coupled to the nbias_filt node. Therefore, Increases in the voltage vdda will increase the current through transistor MN5, and since the current through transistor MP4 is constant, the increased current in transistor MN5 will cause reduced current through the first branch of the third current mirror (e.g., through transistors MN8 and MN10). This reduced current through transistor MN8 will lead to decreased current through the second branch of the third current mirror (through transistors MN9 and MN11) and through the first branch of the fourth current mirror (through transistors MP7 and MP8), which will cause an amplified current reduction in the n-type current-setting transistor (e.g., transistor MN1 in inverter 212a or transistor MN2 in inverter 212b) and in the p-type current-setting transistor (e.g., transistor MP2 in inverter 212a or transistor MP1 in inverter 212b) amplified by the ratio 1:N. This current reduction in the n-type and p-type current-setting transistors will lead to a weaker current-starved inverter, which is the objective when the voltage vdda increases. In other words, when the voltage vdda increases, the main inverter in the clock distribution chain will have a stronger current (e.g., leading to less delay and a speeding up of the clock signal edges), but the auxiliary inverter will have an amplified weaker current (e.g., amplified by M×N), which leads to more delay and slows down the clock signal edges. In this manner, current-domain cancellation, or at least reduction, is accomplished.

Likewise, decreases in the voltage vdda will have the opposite effect. More specifically, decreases in the voltage vdda will reduce the current through transistor MN5, and since the current through transistor MP4 is constant, the reduced current in transistor MN5 will cause increased current through the first branch of the third current mirror (e.g., through transistors MN8 and MN10). This increased current through transistor MN8 will lead to increased current through the second branch of the third current mirror (through transistors MN9 and MN11) and through the first branch of the fourth current mirror (through transistors MP7 and MP8), which will be amplified by the ratio 1:N in the n-type current-setting transistor (e.g., transistor MN1 in inverter 212a or transistor MN2 in inverter 212b) and in the p-type current-setting transistor (e.g., transistor MP2 in inverter 212a or transistor MP1 in inverter 212b). This amplified current increase in the n-type and p-type current-setting transistors will lead to a stronger current-starved inverter, which is the objective when the voltage vdda decreases. In other words, when the voltage vdda decreases, the main inverter in the clock distribution chain will have a weaker current (e.g., leading to more delay and a slowing down of the clock signal edges), but the auxiliary inverter will have an amplified stronger current (amplified by M×N), which leads to less delay and speeds up the clock signal edges. In this manner, current-domain cancellation, or at least reduction, is accomplished, in the opposite direction from that described above.

The techniques described herein provide a low area and low power solution to tackle low frequency spurs associated with the power supply ripple (e.g., due to switched-mode power supply ripple at the switching frequency). The techniques are also independent of the clock frequency and the rise and fall times of the clock signals. This is because the spur cancellation, or at least reduction, is done for very low frequencies compared to the end-to-end delay of the clock distribution chain. The techniques described herein can work with multiple clocking power supplies, where each clock distribution chain with a different supply can incorporate one or more auxiliary inverters.

Example Operations

Figure 5:
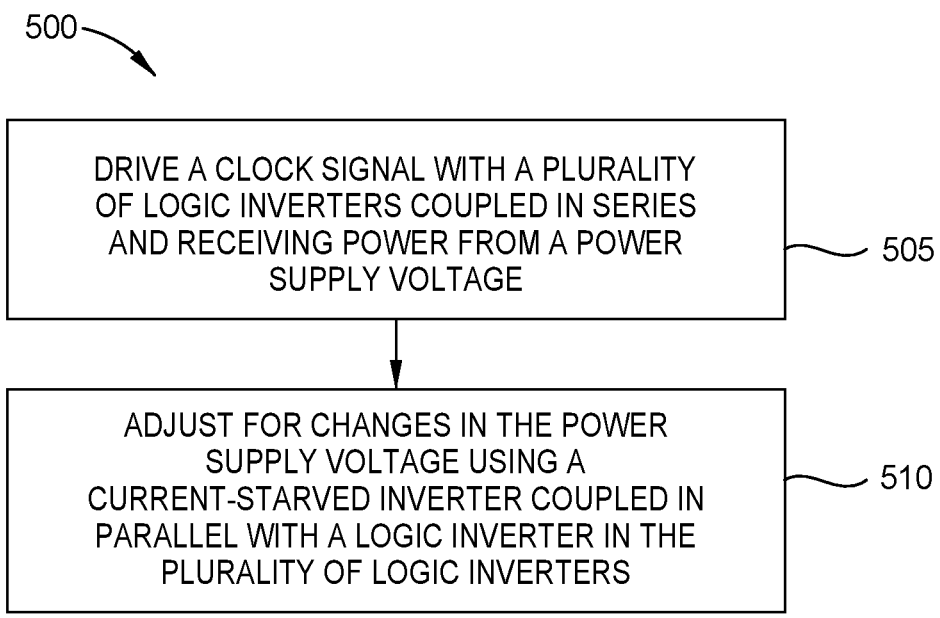
FIG. 5 is a flow diagram of example operations for clock distribution, according to certain aspects of the present disclosure.

FIG. 5 is a flow diagram of example operations 500 for clock distribution, according to certain aspects of the present disclosure. The operations 500 may be performed by a clock distribution network (e.g., the clock distribution chain 100 of FIG. 18) with one or more current-starved inverters (e.g., the auxiliary inverter 202).

The operations 500 may begin, at block 505, by driving a clock signal (e.g., clk) with a plurality of logic inverters (e.g., logic inverters 104) coupled in series and receiving power from a power supply voltage (e.g., unregulated supply voltage vdda). At block 510, a current-starved inverter (e.g., inverter 212a or 212b) may be used to adjust for changes in the power supply voltage. The current-starved inverter is coupled in parallel (or in series) with a logic inverter (e.g., main logic inverter $104_{n-1}$) in the plurality of logic inverters.

According to certain aspects, the adjusting at block 510 may include lowering an inverter current of the current-starved inverter when the power supply voltage increases and raising the inverter current of the current-starved inverter when the power supply voltage decreases.

According to certain aspects, the adjusting at block 510 may involve generating a reference current (e.g., $I_{bias}$); generating a mirrored current (e.g., current through transistors MN4, MP3, MP4, and/or MN5) based on the reference current using at least one current mirror (e.g. the first current mirror 304 or 404 and/or the second current mirror 306 or 406); sensing current changes relative to the mirrored current due to the changes in the power supply voltage (e.g., changes to the current through transistor MP4 or MN5); amplifying the sensed current changes (e.g., due to ratio 1:M and/or 1:N); and controlling an inverter current of the current-starved inverter (e.g., current through transistor MP2 or MN1 in inverter 212a or current through transistor MP1 or MN2 in inverter 212b) based on the amplified current changes.

According to certain aspects, the adjusting at block 510 further includes using another current-starved inverter coupled in parallel (or in series) with another logic inverter in the plurality of logic inverters.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The various processes in methods described above may be performed by any suitable means capable of performing the corresponding process functions. Such means may include various hardware and/or software component(s) and/or module(s), including, but not limited to a circuit, a field-programmable gate array (FPGA) or other programmable logic, an application-specific integrated circuit (ASIC), or a processor. Generally, where there are operations illustrated in figures, those operations may have corresponding counterpart means-plus-function components with similar numbering.

In the preceding, reference is made to aspects presented in this disclosure. However, the scope of the present disclosure is not limited to specific described aspects. Instead, any combination of the described features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the preceding aspects, features, and advantages are merely illustrative and are not considered elements or limitations of the appended claims except where explicitly recited in a claim. In other words, other and further examples may be devised without departing from the basic scope of the present disclosure, and the scope thereof is determined by the claims that follow.

What is claimed is:

1. A circuit for clock distribution, the circuit comprising:
   a plurality of logic inverters coupled in series and configured to drive a clock signal;
   a current-starved inverter coupled in parallel with a logic inverter in the plurality of logic inverters; and
   a biasing circuit having a first bias node and a second bias node coupled to the current-starving inverter and configured to control a current through the current-starved inverter, wherein the biasing circuit comprises:
   a reference current source;
   a first current mirror coupled to the reference current source;
   a second current mirror coupled to the first current mirror;
   a third current mirror coupled to the second current mirror;
   a fourth current mirror coupled to the third current mirror and comprising the second bias node and a first current-setting transistor in the current-starved inverter; and
   a fifth current mirror coupled to the fourth current mirror and comprising the first bias node and a second current-setting transistor in the current-starved inverter.

2. The circuit of claim 1, wherein the logic inverter has a power input coupled to a power supply rail configured to have a power supply voltage and wherein the current-starved inverter is configured to:
   decrease an inverter current and increase a delay in the clock signal when the power supply voltage increases; and
   increase the inverter current and decrease the delay in the clock signal when the power supply voltage decreases.

3. The circuit of claim 1, wherein the current-starved inverter comprises:
   a first transistor having a gate coupled to an input of the logic inverter and having a source coupled to a power supply rail;

a second transistor having a gate coupled to the first bias node, having a source coupled to a drain of the first transistor, and having a drain coupled to an output of the logic inverter;
a third transistor having a gate coupled to the second bias node and having a drain coupled to the output of the logic inverter; and
a fourth transistor having a gate coupled to the input of the logic inverter, having a drain coupled to a source of the third transistor, and having a source coupled to a reference potential node.

4. The circuit of claim 1, wherein the current-starved inverter comprises:
a first transistor having a gate coupled to the first bias node and having a source coupled to a power supply rail;
a second transistor having a gate coupled to an input of the logic inverter, having a source coupled to a drain of the first transistor, and having a drain coupled to an output of the logic inverter;
a third transistor having a gate coupled to the input of the logic inverter and having a drain coupled to the output of the logic inverter; and
a fourth transistor having a gate coupled to the second bias node, having a drain coupled to a source of the third transistor, and having a source coupled to a reference potential node.

5. The circuit of claim 1, wherein the second current mirror comprises a low-pass filter coupled between branches of the second current mirror.

6. The circuit of claim 1, wherein:
the first current mirror is configured to set a bias voltage on a node between branches of the first current mirror;
the first current mirror comprises a current sink coupled to the second current mirror and to the third current mirror; and
the current sink is configured to be controlled by the bias voltage.

7. The circuit of claim 1, wherein:
the second current mirror is configured to set a bias voltage on a node between branches of the second current mirror;
the second current mirror comprises a current source coupled to the third current mirror and to the fourth current mirror; and
the current source is configured to be controlled by the bias voltage.

8. The circuit of claim 1, wherein the fifth current mirror further comprises:
a first transistor having a gate and a drain coupled to an output branch of the fourth current mirror and to the first bias node of the biasing circuit; and
a second transistor having a gate coupled to a reference potential node, wherein the first transistor or the second transistor has a source coupled to a power supply rail, the power supply rail being coupled to a power input of the logic inverter and a power input of the current-starved inverter.

9. The circuit of claim 8, wherein:
the output branch of the fourth current mirror comprises a third transistor having a gate coupled to the power supply rail and a fourth transistor having a gate coupled to the second bias node; and
an input branch of the fourth current mirror comprises a fifth transistor having a gate coupled to the power supply rail and a sixth transistor having a gate coupled to a drain of the sixth transistor and to the second bias node.

10. A circuit for clock distribution, the circuit comprising:
a plurality of logic inverters coupled in series and configured to drive a clock signal; and
a current-starved inverter coupled in parallel with a logic inverter in the plurality of logic inverters; and
a biasing circuit having a first bias node and a second bias node coupled to the current-starving inverter and configured to control a current through the current-starved inverter, wherein the biasing circuit comprises:
a first current mirror;
a second current mirror coupled to the first current mirror;
a third current mirror coupled to the second current mirror and comprising the second bias node and a first current-setting transistor in the current-starved inverter; and
a fourth current mirror coupled to the third current mirror and comprising the first bias node and a second current-setting transistor in the current-starved inverter.

11. The circuit of claim 10, wherein:
a power supply rail is coupled to a power input of the logic inverter and to a power input of the current-starved inverter;
the first current mirror comprises a current sink coupled to the second current mirror and to the third current mirror;
the first current mirror further comprises a high-pass filter having an input coupled to the power supply rail and having an output coupled to a control input of the current sink;
the high-pass filter is referenced to a node between first and second branches of the first current mirror; and
the current sink is disposed in a third branch of the first current mirror and is configured to be controlled by a high-pass-filtered version of a power supply voltage on the power supply rail.

12. The circuit of claim 10, wherein the fourth current mirror further comprises:
a first transistor having a gate and a drain coupled to an output branch of the third current mirror and to the first bias node of the biasing circuit; and
a second transistor having a gate coupled to a reference potential node, wherein the first transistor or the second transistor has a source coupled to a power supply rail, the power supply rail being coupled to a power input of the logic inverter and to a power input of the current-starved inverter.

13. The circuit of claim 12, wherein:
the output branch of the third current mirror comprises a third transistor having a gate coupled to the power supply rail and a fourth transistor having a gate coupled to the second bias node; and
an input branch of the third current mirror comprises a fifth transistor having a gate coupled to the power supply rail and a sixth transistor having a gate coupled to a drain of the sixth transistor and to the second bias node.

14. The circuit of claim 1, further comprising another current-starved inverter coupled in parallel or in series with another logic inverter in the plurality of logic inverters.

15. A method of clock distribution, comprising:
- driving a clock signal with a plurality of logic inverters coupled in series and receiving power from a power supply voltage; and
- adjusting for changes in the power supply voltage using a current-starved inverter coupled in parallel with a logic inverter in the plurality of logic inverters; wherein the adjusting comprises:
  - generating a reference current;
  - generating a mirrored current based on the reference current using at least one current mirror;
  - sensing current changes relative to the mirrored current due to the changes in the power supply voltage;
  - amplifying the sensed current changes; and
  - controlling an inverter current of the current-starved inverter based on the amplified current changes.

16. The method of claim 15, wherein the adjusting comprises lowering an inverter current of the current-starved inverter when the power supply voltage increases and raising the inverter current of the current-starved inverter when the power supply voltage decreases.

17. The method of claim 15, wherein the adjusting further comprises using another current-starved inverter coupled in parallel or in series with another logic inverter in the plurality of logic inverters.

* * * * *